United States Patent
Klee et al.

(10) Patent No.: US 6,768,396 B2
(45) Date of Patent: Jul. 27, 2004

(54) FILTER ARRANGEMENT

(75) Inventors: Mareike Katharine Klee, Hückelhoven (DE); Hans Peter Löbl, Monschau-Imgenbroich (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/745,959

(22) Filed: Dec. 21, 2000

(65) Prior Publication Data

US 2002/0021192 A1 Feb. 21, 2002

(30) Foreign Application Priority Data

Dec. 22, 1999 (DE) .......................................... 199 62 028

(51) Int. Cl.[7] .................................................. H03H 9/54
(52) U.S. Cl. ...................................... 333/187; 333/191
(58) Field of Search ............................. 333/186, 187, 333/188, 191

(56) References Cited

U.S. PATENT DOCUMENTS

| | | | | |
|---|---|---|---|---|
| 4,285,001 A | * | 8/1981 | Gerzberg et al. | 357/51 |
| 5,185,803 A | * | 2/1993 | Moyski et al. | 381/86 |
| 5,519,890 A | * | 5/1996 | Pinckley | 455/307 |
| 5,589,082 A | * | 12/1996 | Lin et al. | 216/2 |
| 5,594,394 A | * | 1/1997 | Sasaki et al. | 333/103 |
| 5,714,917 A | * | 2/1998 | Ella | 332/144 |
| 5,883,575 A | * | 3/1999 | Ruby et al. | 340/572 |
| 5,910,756 A | * | 6/1999 | Ella | 333/133 |
| 6,021,192 A | * | 2/2000 | Jones | 379/283 |
| 6,081,171 A | * | 6/2000 | Ella | 333/189 |
| 6,255,714 B1 | * | 7/2001 | Kossives et al. | 257/528 |

FOREIGN PATENT DOCUMENTS

EP 0949756 A2 10/1999

* cited by examiner

*Primary Examiner*—Robert Pascal
*Assistant Examiner*—Dean Takaoka
(74) *Attorney, Agent, or Firm*—Aaron Waxler

(57) ABSTRACT

The invention describes a filter arrangement comprising a bandpass filter and a notch filter. The coupling of a notch filter, which consists of a capacitor and an inductance, to a bandpass filter comprising resonators achieves a better suppression outside the passband.

Figure 1:
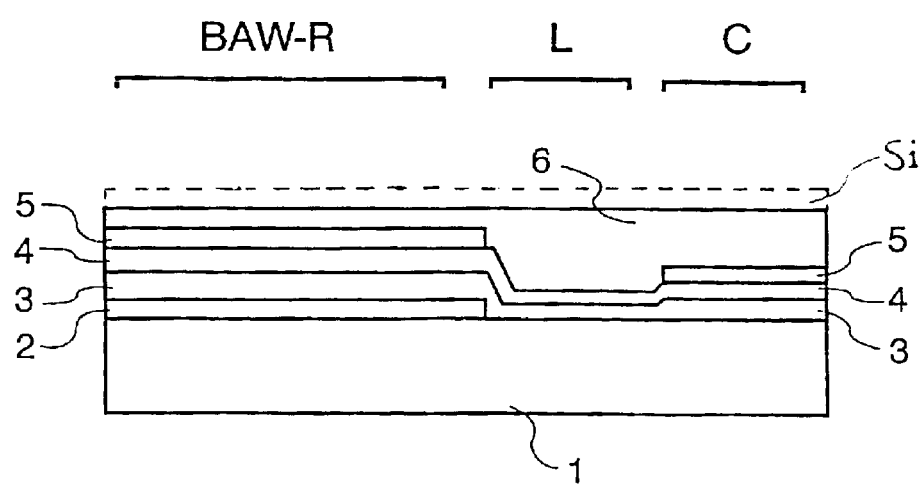

The two filters can be manufactured on one substrate (1) in a small space through the use of thin-film techniques. Moreover, a transmitter, a receiver, a mobile telephone appliance, and a wireless data transfer system with such a filter arrangement are disclosed, as is a method of manufacturing such a filter arrangement.

3 Claims, 3 Drawing Sheets

FILTER ARRANGEMENT

TECHNICAL FIELD

The invention relates to a filter arrangement. The invention further relates to a transmitter, a receiver, a mobile telephone appliance with a filter arrangement, and to a wireless data transfer system, as well as to a method of manufacturing a filter arrangement.

BACKGROUND OF THE INVENTION

The stormy developments in the field of mobile telephony and the continuing miniaturization of the cordless telephone appliances lead to higher requirements being imposed on the individual components. Thus a higher selectivity is necessary in the high-frequency range for protecting the receiver against the rising number of potentially interfering signals from other systems. This is achieved, for example, by means of bandpass filters which allow only a limited frequency band to pass and which suppress all frequencies above and below this band.

Among the devices which are used at the present time for this purpose are filters with ceramic electromagnetic resonators. A miniaturization of these filters, however, is limited by the electromagnetic wavelength. Much smaller designs can be achieved with so-called surface acoustic wave (SAW) filters. This is because the acoustic wavelength is smaller than the electromagnetic wavelength by 4 to 5 orders of magnitude. A disadvantage is, however, that surface acoustic wave filters often have a complicated construction and are protected by means of complicated housings. An alternative is offered by bulk acoustic wave (BAW) filters. Bulk acoustic wave filters have advantages as regards their size, power, and IC compatibility.

In practice, however, said filters do not fully filter out the frequencies lying outside the passband, but only to a certain degree. This may be insufficient for certain applications such as, for example, the signal filtering in the high-frequency part of mobile telephones or base stations.

The invention has for its object to provide a filter with a bandpass filter function which shows an improved suppression outside the passband.

This object is achieved by means of a filter arrangement which comprises a substrate on which are provided a bandpass filter and a notch filter, which filters are coupled to one another.

It is advantageous that the notch filter is connected between the input of the bandpass filter and ground or between the output of the bandpass filter and ground.

The coupling of the bandpass filter to a notch filter is capable of achieving a better suppression in the stop band of the bandpass filter at a desired frequency.

It is preferred that the bandpass filter and the notch filter are thin-film filters.

The implementation of the two filters in thin-film technology on a substrate implies that such a filter arrangement is kept within small dimensions.

It is particularly preferred that the bandpass filter comprises a filter arrangement of resonators.

It is furthermore preferred that the filter arrangement comprises bulk acoustic wave resonators, surface acoustic wave resonators, or ceramic electromagnetic resonators.

Bandpass filters composed from a filter arrangement of resonators show lower losses in the passband, because they have better quality factors Q than, for example, LC filters. Moreover, bandpass filters comprising resonators show a steeper slope at the edge of the passband than comparable LC combinations.

It is preferred in particular that a bulk acoustic wave resonator comprises a resonator unit and a reflection element which is arranged between the substrate and the resonator unit.

Such a bulk acoustic wave resonator can be manufactured by means of thin-film techniques in a simple manner and, most of all, with a small space requirement. In addition, such a bulk acoustic wave resonator is clearly more robust than other types of bulk acoustic wave resonators such as single-crystal resonators, resonators with membranes, or resonators with an air gap.

It is furthermore advantageous that the notch filter comprises a capacitor and an inductance.

Such a notch filter can be manufactured by a thin-film technique in a simple, inexpensive, and space-saving manner on the same substrate as the bandpass filter.

The invention furthermore relates to a method of manufacturing a filter arrangement, which comprises a substrate and provided thereon a bandpass filter of bulk acoustic wave resonators and a notch filter, by which method a second electrode, a piezoelectric layer, and a first electrode are provided on a carrier layer and are structured such that at least one resonator unit, a capacitor, and an inductance are created, a reflection element is deposited on those portions of the first electrode which belong to the resonator unit, and a substrate is fastened on the entire assembly, and the carrier layer is removed.

The invention also relates to a transmitter, a receiver, a mobile telephone appliance, and a wireless data transfer system provided with a filter arrangement which comprises a substrate and provided thereon a bandpass filter and a notch filter, said filters being coupled to one another.

The invention will be explained in more detail below with reference to three Figures and three embodiments, wherein

BRIEF DESCRIPTION OF THE DRAWING FIGURES

Figure 2:
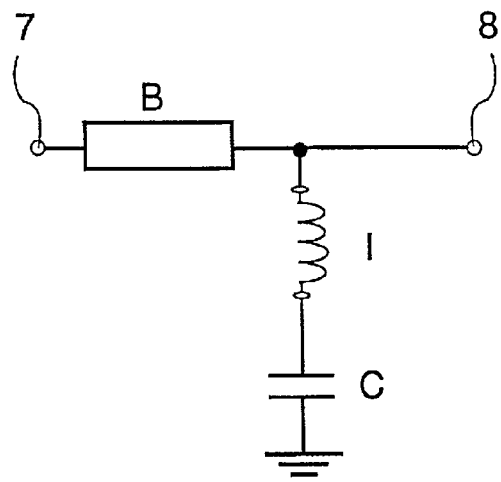
Figure 3:
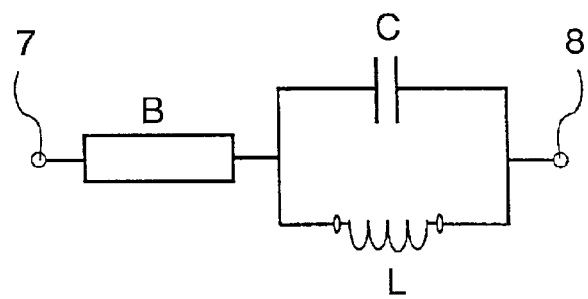
Figure 4:
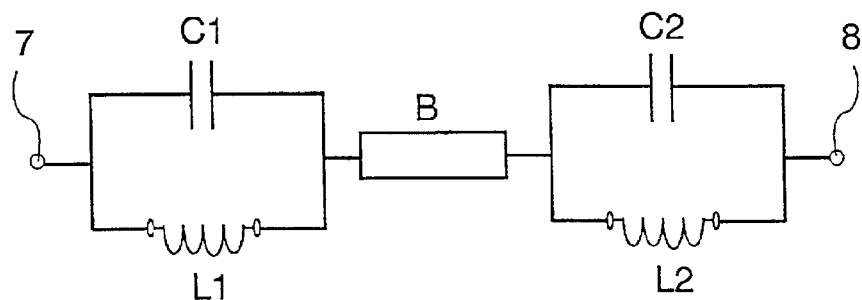
Figure 5:
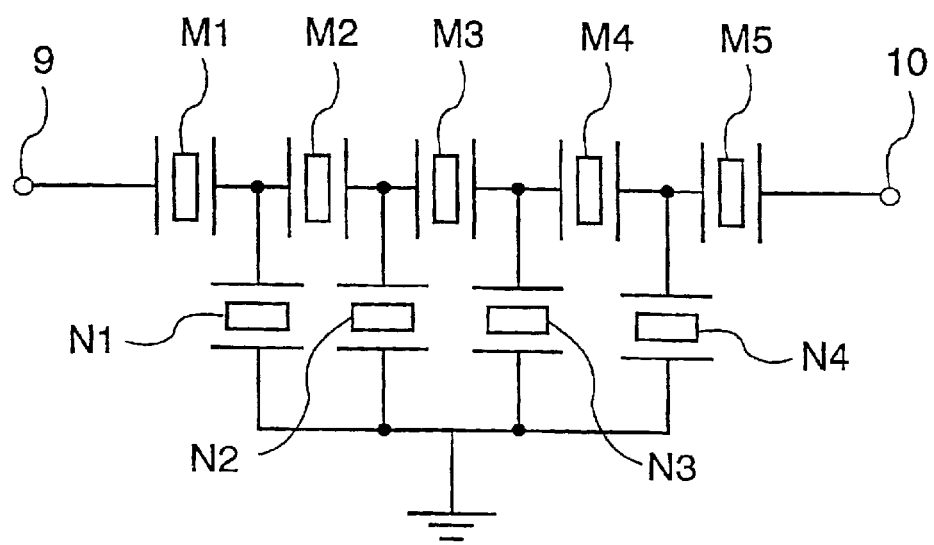

FIG. 1 is a cross-sectional view of a bulk acoustic wave resonator of the bandpass filter and the notch filter of the filter arrangement, FIGS. 2 to 4 show circuit diagrams of a filter arrangement comprising a bandpass filter and one or two notch filters, and FIG. 5 shows the circuit diagram of a bandpass filter arrangement with resonators.

DETAILED DESCRIPTION

In FIG. 1, a filter arrangement with a bandpass filter and a notch filter comprises a substrate 1 which is made, for example, from a ceramic material, a ceramic material with a planarizing layer of glass, a glass-ceramic material, a glass material, silicon, GaAs, or sapphire. If silicon or GaAs is used for the substrate 1, a passivating layer of, for example, $SiO_2$ or glass is additionally provided. A reflection element 2, which is a layer of an acoustically reflecting substance from the group of polymers and porous substances, is present on portions of the substrate 1. Acoustically reflecting substances which may be used are, for example, an aerogel, a xerogel, a glass foam, a foam-type adhesive, a synthetic foam, or a synthetic resin of low density. The aerogel used may be, for example, an inorganic aerogel of silica gel or porous $SiO_2$ structures, or an organic aerogel such as, for example, a resorcin-formaldehyde aerogel, a melamine-formaldehyde aerogel, or a phenol-formaldehyde aerogel. The xerogel used may be, for example, an inorganic xerogel such as highly condensed polysilicic acid or an organic xerogel such as glue or agar—agar. Foam materials may be chemically foamed or physically foamed polymers such as, for example, polystyrol, polycarbonates, polyvinyl chloride, polyurethane, polyisocyanate, polyisocyanurate, polycarbodiimide, polymethacrylimide, polyacrylimide, acryl-butadiene-styrol copolymers, polypropylene, or polyester. In addition, foamed synthetic resins such as, for example, phenolformaldehyde resins or furane resins, which have a high porosity owing to carbonization, may be used. A synthetic resin of low density may be, for example, a cross-linked polyvinyl ether, a cross-linked polyarylether, polytetrafluoroethylene, poly(p-xylylene), poly(2-chloro-p-xylylene), polydichloro-p-xylylene), polybenzocyclobutene, a styrol-butadiene copolymer, an ethylene-vinylacetate polymer, or an organic siloxane polymer. A resonator unit comprising a first electrode 3, a piezoelectric layer 4, and a second electrode 5 is provided on the reflection element 2. The electrodes 3 and 5 are preferably made from a well conducting material which has a low acoustic damping and may comprise, for example, $Ag_{1-x}Pt_x$ ($0 \leq x1$), Pt with a layer thickness of 50 nm to 1 $\mu$m, Ti with a layer thickness of 1 to 20 nm/Pt with a layer thickness of 20 to 600 nm, Ti with a layer thickness of 1 to 20 nm/Pt with a layer thickness of 20 to 600 nm/Ti with a layer thickness of 1 to 20 nm, Al, Al doped with a few percents of Cu, Al doped with a few percents of Si, Al doped with a few percents of Mg, W, Ni, Mo, Au, Cu, Ti/Pt/Al, Ti/Ag, Ti/Ag/Ti, Ti/Ag/Ir, Ti/Ir, Ti/Pd, $Ti/Ag_{1-x}Pt_x$ ($0 \leq x \leq 1$), $Ti/Ag_{1-x}Pd_x$ ($0 \leq x \leq 1$), $Ti/Pt_{1-x}Al_x$ ($0 \leq x \leq 1$), $Pt_{1-x}Al_x$ ($0 \leq x \leq 1$), $Ti/Ag/Pt_{1-x}Al_x$ ($0 \leq x \leq 1$), Ti/Ag/Ru, $Ti/Ag/Ir/IrO_x$ ($0 \leq x \leq 2$), $Ti/Ag/Ru/RuO_x$ ($0 \leq x \leq 2$), $Ti/Ag/Ru/Ru_xPt_{1-x}$($0 \leq x \leq 1$), $Ti/Ag/Ru/Ru_xPt_{1-x}/RuO_y$ ($0 \leq x \leq 1, 0 \leq y \leq 2$), $Ti/Ag/Ru/RuO_x/Ru_yPt_{1-y}$ ($0 \leq x \leq 2, 0 \leq y \leq 1$), $Ti/Ag/Ru_xPt_{1-x}$($0 \leq x \leq 1$), $Ti/Ag/Pt_xAl_{1-x}$ ($0 \leq x \leq 1$), $Pt_xAl_{1-x}/Ag/Pt_yAl_{1-y}$ ($0 \leq x \leq 1, 0 \leq y \leq 1$), $Ti/Ag/Pt_y(RhO_x)_{1-y}$ ($0 \leq x \leq 2, 0 \leq y \leq 1$), $Ti/Ag/Rh/RhO_x$ ($0 \leq x \leq 2$), $Ti/Ag/Pt_xRh_{1-x}$ ($0 \leq x \leq 1$), $Ti/Ag/Pt_y(RhO_x)_{1-y}/Pt_zRh_{1-z}$ ($0 \leq x \leq 2, 0 \leq y \leq 1, 0 \leq z \leq 1$), $Ti/Ag_xPt_{1-x}/Ir$ ($0 \leq x \leq 1$), $Ti/Ag_xPt_{1-x}/Ir/IrO_y$ ($0 \leq x \leq 2, 0 \leq y \leq 1$), $Ti/Ag_xPt_{1-x}/Pt_yAl_{1-y}$ ($0 \leq x \leq 1, 0 \leq y \leq 1$), $Ti/Ag_xPt_{1-x}/Ru$ ($0 \leq x \leq 1$), $Ti/Ag_xPt_{1-x}/Ru/RuO_y$ ($0 \leq x \leq 1, 0 \leq y \leq 2$), Ti/Ag/Cr, Ti/Ag/Ti/ITO, Ti/Ag/Cr/ITO, Ti/Ag/ITO, Ti/Ni/ITO, Ti/Rh, Ti/Ru, Rh, Ti/Ni/Al/ITO, Ti/Ni, Ti/W/Ti, $W_xTi_{1-x}$ ($0 \leq x \leq 1$), $W_xTi_{1-x}/Al(Cu)$ ($0 \leq x \leq 1$), $W_xTi_{1-x}/Al(Si)$ ($0 \leq x \leq 1$), $W_xTi_{1-x}/Al$ ($0 \leq x \leq 1$) or Ti/Cu. The material used for the piezoelectric layer 4 may be, for example, AlN, ZnO, $PbZr_xTi_{1-x}O_3$ ($0 \leq x \leq 1$) with and without dopants of La, Mn, Fe, Sb, Sr, Ni or combinations of these dopants, $LiNbO_3$, $LiTaO_3$, $PbNb_2O_6$, $Pb(Zn_{1/3}Nb_{2/3})O_3$—$PbTiO_3$, $Pb(Mg_{1/3}Nb_{2/3})O_3$—$PbTiO_3$, $Pb(Ni_{1/3}Nb_{2/3})O_3$—$PbTiO_3$, $Pb(Sc_{1/3}Nb_{2/3})O_3$—$PbTiO_3$, $Pb(Zn_{1/3}Nb_{2/3})_{1-x-y}(Mn_{1/2}Nb_{1/2})_xTi_yO_3$ ($0 \leq x \leq 1, 0 \leq y \leq 1$), $Pb(In_{1/2}Nb_{1/2})O_3$—$PbTiO_3$, $Sr_3TaGa_3Si_2O_{14}$, $K(Sr_{1-x}Ba_x)_2Nb_5O_{15}$($0 \leq x \leq 1$), $Na(Sr_{1-x}Ba_x)_2Nb_5O_{15}$($0 \leq x \leq 1$), $BaTiO_3$, $(K_{1-x}Na_x)NbO_3$($0 \leq x \leq 1$), $(Bi,Na,K,Pb,Ba)TiO_3$, $(Bi,Na)TiO_3$, $Bi_7Ti_4NbO_{21}$, $(K_{1-x}Na_x)NbO_3$—$(Bi,Na,K,Pb,Ba)TiO_3$ ($0 \leq x \leq 1$), $a(Bi_xNa_{1-x})TiO_{3-b}(KNbO_{3-c})\frac{1}{2}(Bi_2O_3$—$Sc_2O_3)$ ($0 \leq x \leq 1, a+b+c=1$), $(Ba_aSr_bCa_c)Ti_xZr_{1-x}O_3$ ($0 \leq x \leq 1, a+b+c=1$), $(Ba_aSr_bLa_c)Bi_4Ti_4O_{15}$ ($a+b+c=1$), $Bi_4Ti_3O_{12}$, $La_3Ga_{5.5}Nb_{0.5}O_{14}$, $La_3Ga_5SiO_{14}$, $La_3Ga_{5.5}Ta_{0.5}O_{14}$ or polyvinylidene fluoride (PVDF).

The electrodes 3 and 5 and the piezoelectric layer 4 are structured such that on the one hand a bandpass filter is created comprising an arrangement of bulk acoustic wave resonators. On the other hand, the two electrodes 3 and 5 and the piezoelectric layer 4 are structured in a different region of the substrate 1 such that a notch filter comprising an inductance and a capacitor is created adjacent the bandpass filter. The notch filter is connected between the input or output of the bandpass filter and ground. The capacitor comprises a dielectric which is formed from the piezoelectric layer 4, and the two electrodes 3 and 5. An inductance is created in series with the capacitor through a suitable design of the first electrode 3 or the second electrode 5.

Alternatively, the dielectric of the capacitor may be formed not from the piezoelectric layer 4, but from some other dielectric material having a low dielectric constant of $2 \leq \epsilon \leq 300$ such as, for example, $SiO_2$, $Si_3N_4$, $Si_xO_yN_z$ ($0 \leq x \leq 1, 0 \leq y \leq 1, 0 \leq z \leq 1$), $Ta_2O_5$, $Ta_2O_5$—$Al_2O_3$, $Ta_2O_5$—$Nb_2O_5$, $Ta_2O_5$—$TiO_2$, or $TiO_2$.

Similarly, an electrode of the capacitor may be formed from a separate electrically conducting layer.

A protective layer 6 of an organic or inorganic material, or a combination of these materials, may be provided over the entire filter arrangement. An organic material which may be used is, for example, polybenzocyclobutene or polyimide, while suitable inorganic materials are, for example, $Si_3N_4$, $SiO_2$ or $Si_xO_yN_z$ ($0 \leq x \leq 1, 0 \leq y \leq 1, 0 \leq z \leq 1$).

Alternatively, the reflection element 2 may comprise several layers of alternately high and low impedance. The material of low impedance may then be, for example, an organic or inorganic aerogel, an organic or inorganic xerogel, a glass foam, a foam-type adhesive, a synthetic foam substance, or a synthetic resin of low density. The material of high acoustic impedance may be, for example, $HfO_2$, Mo, Au, Ni, Cu, W, Ti/W/Ti, $W_xTi_{1-x}$ ($0 \leq x \leq 1$), diamond, $Ta_2O_5$, Pt, Ti/Pt, or a synthetic resin of high density such as, for example, high-density polyethylene (HDPE).

Optionally, an alternative type such as, for example, a single-crystal resonator, a resonator with membrane, or a resonator with an air gap may be used instead of a bulk acoustic wave resonator.

Apart from bulk acoustic wave resonators, surface acoustic wave resonators or ceramic electromagnetic resonators may alternatively be used.

Furthermore, a second reflection element may be provided on the upper electrode 5 in a further embodiment of the invention.

A further alternative is that an additional adhesive layer, for example of an acrylate glue or an epoxy glue, is provided between the reflection element 2 and the substrate 1. The acrylate glue may comprise, for example, acryl or methacryl monomers, which polymerize during the bonding process.

Furthermore, a layer of $SiO_2$ with a layer thickness of between 30 and 300 mn may be provided above or below, or above and below a reflection element 2 of porous $SiO_2$. These $SiO_2$ layers, the reflection element 2, and a second reflection element may also be provided over the entire region of the substrate 1.

Moreover, the entire filter arrangement may be provided with at least a first and a second current supply contact. A current supply contact which may be used is, for example, an electroplated SMD end contact of Cr/Cu, Ni/Sn, or Cr/Cu, Cu/Ni/Sn, or Cr/Ni, Pb/Sn, or a bump end contact, or a contact pad.

Alternative embodiments as to the construction and integration are known to those skilled in the art.

Such a filter arrangement may be used in the field of mobile telephony and in any other field of radio transmission (for example for DECT or CT cordless telephones, for radio relay or trunking devices, or for pagers), wherever a filtering of signals is required.

FIG. 2 shows the circuit of a filter arrangement with a bandpass filter and a notch filter. Between an input 7 and an output 8 there is a bandpass filter B which comprises a circuit, for example, as shown in FIG. 5. The notch filter, which comprises an inductance I and a capacitor C connected in series, is arranged between the output of the bandpass filter B and ground. The second terminal of the capacitor C is connected to ground potential.

Alternatively, the circuit may comprise two or more notch filters which are connected between the input of the bandpass filter B and ground or between the output of the bandpass filter B and ground, or between the output and input of the bandpass filter and ground.

FIG. 3 shows the circuit diagram of a filter arrangement with a bandpass filter and a notch filter. A bandpass filter B is connected between an input 7 and an output 8 and comprises, for example, a circuit arrangement as shown in FIG. 5. The notch filter, which comprises an inductance L and a capacitor C connected in parallel, is present between the output of the bandpass filter B and the output 8.

FIG. 4 shows a circuit diagram of a filter arrangement with a bandpass filter and two notch filters. An inductance L1 and a capacitor C1 connected in parallel are situated between an input 7 and the input of the bandpass filter B, which comprises, for example, a circuit arrangement as shown in FIG. 5. The second notch filter, which comprises an inductance L2 and a capacitor C2 connected in parallel, is present between the output of the bandpass filter B and the output 8.

In these circuit arrangements, in which the bandpass filter B and the notch filter(s) are connected in series, the inductance L may be chosen to lie in the nH range and the capacitance in the pF range. Parasitic line inductances may then be utilized for realizing the inductance L.

FIG. 5 shows a bandpass filter arrangement comprising a total of nine resonator units M1 to M5 and N1 to N4. Five resonator units M1 to M5 are connected in series between an input 9 and an output 10. Four further resonator units N1 to N4 are connected in parallel to these five resonator units M1 to M5. One terminal of each of the four resonator units N1 to N4 is at ground potential. The other terminal of the resonator unit N1 lies between the resonator units M1 and M2. The other terminal of the resonator unit N2 lies between the resonator units M2 and M3. The other terminal of the resonator unit N3 lies between the resonator units M3 and M4. Finally, the other terminal of the resonator unit N4 lies between the resonator units M4 and M5.

A possibility for creating a filter arrangement with a bandpass filter and notch filter is that in a first step a resonator unit is deposited on a carrier layer, which unit comprises in reverse order a second electrode 5, a piezoelectric layer 4, and a first electrode 3. The carrier layer may consist, for example, of a ceramic material, a ceramic material with a planarizing layer of glass, a glass-ceramic material, silicon, GaAs, or sapphire. If silicon or GaAs is used in the carrier layer, an additional passivating layer of, for example, $SiO_2$ or glass is provided. The electrodes 3 and 5 are preferably made of a well conducting material with low acoustic damping and may comprise, for example, $Ag_{1-x}Pt_x$ ($0 \leq x \leq 1$), Pt with a layer thickness of 50 nm to 1 $\mu$m, Ti with a layer thickness of 1 to 20 nm/Pt with a layer thickness of 20 to 600 nm, Ti with a layer thickness of 1 to 20 nm/Pt with a layer thickness of 20 to 600 nm/Ti with a layer thickness of 1 to 20 nm, Al, Al doped with a few percents of Cu, Al doped with a few percents of Si, Al doped with a few percents of Mg, Ni, W, Mo, Au, Cu, Ti/Pt/Al, Ti/Ag, Ti/Ag/Ti, Ti/Ag/Ir, Ti/Ir, Ti/Pd, Ti/$Ag_{1-x}Pt_x$ ($0 \leq x \leq 1$), Ti/$Ag_{1-x}Pd_x$ ($0 \leq x \leq 1$), Ti/$Pt_{1-x}Al_x$ ($0 \leq x \leq 1$) $Pt_{1-x}Al_x$ ($0 \leq x \leq 1$) Ti/Ag/$Pt_{1-x}Al_x$ ($0 \leq x \leq 1$), Ti/Ag/Ru, Ti/Ag/Ir/$IrO_x$ ($0 \leq x \leq 2$), Ti/Ag/Ru/$RuO_x$ ($0 \leq x \leq 2$), Ti/Ag/Ru/$Ru_xPt_{1-x}$ ($0 \leq x \leq 1$), Ti/Ag/Ru/$Ru_xPt_{1-x}$/$RuO_y$ ($0 \leq x \leq 1$, $0 \leq y \leq 2$), Ti/Ag/Ru/$RuO_x$/$Ru_yPt_{1-y}$ ($0 \leq x \leq 2$, $0 \leq y \leq 1$), Ti/Ag/$Ru_xPt_{1-x}$ ($0 \leq x \leq 1$), Ti/Ag/$Pt_xAl_{1-x}$ ($0 \leq x \leq 1$), $Pt_xAl_{1-x}$/Ag/$Pt_yAl_{1-y}$ ($0 \leq x \leq 1$, $0 \leq y \leq 1$), Ti/Ag/$Pt_y(RhO_x)_{1-y}$ ($0 \leq x \leq 2$, $0 \leq y \leq 1$), Ti/Ag/Rh/$RhO_x$ ($0 \leq x \leq 2$), Ti/Ag/$Pt_xRh_{1-x}$ ($0 \leq x \leq 1$), Ti/Ag/$Pt_y(RhO_x)_{1-y}$/$Pt_zRh_{1-z}$ ($0 \leq x \leq 2$, $0 \leq y \leq 1$, $0 \leq z \leq 1$), Ti/$Ag_xPt_{1-x}$/Ir ($0 \leq x \leq 1$), Ti/$Ag_xPt_{1-x}$/Ir/$IrO_y$ ($0 \leq x \leq 1$, $0 \leq y \leq 2$), Ti/$Ag_xPt_{1-x}$/$Pt_yAl_{1-y}$ ($0 \leq x \leq 1$, $0 \leq y \leq 1$), Ti/$Ag_xPt_{1-x}$/Ru ($0 \leq x \leq 1$), Ti/$Ag_xPt_{1-x}$/Ru/$RuO_y$ ($0 \leq x \leq 1$, $0 \leq y \leq 2$), Ti/Ag/Cr, Ti/Ag/Ti/ITO, Ti/Ag/Cr/ITO, Ti/Ag/ITO, Ti/Ni/ITO, Ti/Rh, Ti/Ru, Rh, Ti/Ni/Al/ITO, Ti/Ni, Ti/W/Ti, $W_xTi_{1-x}$ ($0 \leq x \leq 1$), $W_xTi_{1-x}$/Al(Cu) ($0 \leq x \leq 1$), $W_xTi_{1-x}$/Al(Si) ($0 \leq x \leq 1$), $W_xTi_{1-x}$/Al ($0 \leq x \leq 1$) or Ti/Cu. The material used for the piezoelectric layer 4 may be, for example, AlN, ZnO, $PbZr_xTi_{1-x}O_3$ ($0 \leq x \leq 1$) with and without dopants of La, Mn, Fe, Sb, Sr, Ni or combinations of these dopants, $LiNbO_3$, $LiTaO_3$, $PbNb_2O_6$, $Pb(Zn_{1/3}Nb_{2/3})O_3$—$PbTiO_3$, $Pb(Mg_{1/3}Nb_{2/3})O_3$—$PbTiO_3$, $Pb(Ni_{1/3}Nb_{2/3})O_3$—$PbTiO_3$, $Pb(Sc_{1/3}Nb_{2/3})O_3$—$PbTiO_3$, $Pb(Zn_{1/3}Nb_{2/3})_{1-x-y}(Mn_{1/2}Nb_{1/2})_xTi_yO_3$ ($0 \leq x \leq 1$, $0 \leq y \leq 1$), $Pb(In_{1/2}Nb_{1/2})O_3$—$PbTiO_3$, $Sr_3TaGa_3Si_2O_{14}$, $K(Sr_{1-x}Ba_x)_2Nb_5O_{15}$ ($0 \leq x \leq 1$), $Na(Sr_{1-x}Ba_x)_2Nb_5O_{15}$ ($0 \leq x \leq 1$), $BaTiO_3$, $(K_{1-x}Na_x)NbO_3$ ($0 \leq x \leq 1$), (Bi, Na, K, Pb, Ba) $TiO_3$, (Bi,Na)$TiO_3$, $Bi_7Ti_4NbO_{21}$, $(K_{1-x}Na_x)NbO_3$—(Bi,Na,K,Pb,Ba)$TiO_3$ ($0 \leq x \leq 1$), $a(Bi_xNa_{1-x})TiO_{3-b}(KNbO_{3-c})1/2(Bi_2O_3$—$Sc_2O_3)$ ($0 \leq x \leq 1$, a+b+c=1), $(Ba_aSr_bCa_c)Ti_xZr_{1-x}O_3$ ($0 \leq x \leq 1$, a+b+c=1), $(Ba_aSr_bLa_c)Bi_4Ti_4O_{15}$(a+b+c=1), $Bi_4Ti_3O_{12}$, $La_3Ga_{5.5}Nb_{0.5}O_{14}$, $La_3Ga_5SiO_{14}$, $La_3Ga_{5.5}Ta_{0.5}O_{14}$ or polyvinylidene fluoride (PVDF). The piezoelectric layer 4 and the two electrodes 3 and 5 are deposited and structured such that on the one hand a bandpass filter comprising an arrangement of bulk acoustic wave resonators is created. On the other hand, the two electrodes 3 and 5 and the piezoelectric layer 4 are structured in a different portion of the carrier layer such that a capacitor is formed in the vicinity of the bandpass filter, which capacitor comprises a dielectric formed from the piezoelectric layer 4 and the two electrodes 3 and 5. An inductance is created in series with the capacitor through a suitable design of the first electrode 3 or the second electrode 5. A reflection element 2 of an acoustically reflecting surface from the group of polymers and porous substances is provided on the first electrode 3 in that region where the bulk acoustic wave resonator units are present. Acoustically reflecting substances which may be used are, for example, an aerogel, a xerogel, a glass foam, a foam-type adhesive, a synthetic foam, or a synthetic resin of low density. The aerogel used may be, for example, an inorganic aerogel of silica gel or porous $SiO_2$ structures, or an organic aerogel such as, for example, a resorcin-formaldehyde aerogel, a melamine-formaldehyde aero gel, or a phenol-formaldehyde aerogel. The xero gel used may be, for example, an inorganic xerogel such as highly condensed polysilicic acid or an organic xerogel such as glue or agar—agar. Foam materials may be chemically foamed or physically foamed polymers such as, for example, polystyrol, polycarbonates, polyvinyl chloride, polyurethane, polyisocyanate, polyisocyanurate, polycarbodiimide, polymethacrylimide, polyacrylimide, acryl-butadiene-styrol copolymers, polypropylene, or polyester. In addition, foamed synthetic resins such as, for example, phenolformaldehyde resins or furane resins, which have a high porosity owing to carbonization, may be used. A synthetic resin of low density may be, for example, a cross-linked polyvinyl ether, a cross-linked polyarylether, polytetrafluoroethylene, poly(p-xylylene), poly(2-chloro-p-xylylene), polydichloro-p-xylylene), polybenzocyclobutene, a styrol-butadiene copolymer, an ethylene-vinylacetate polymer, or an organic siloxane polymer. A substrate 1 of glass, a glass-ceramic material, a glass-ceramic material with a glass planarizing layer, a glass material, silicon, GaAs, or sapphire is fastened on this reflection element 2 by means of the adhesive properties of the material used or by means of an additional adhesive, for example an acrylate glue or an epoxy glue. If silicon or GaAs is used as the substrate 1, an additional passivating layer, for example of $SiO_2$ or glass, is provided. Subsequently, the carrier layer is removed mechanically or chemically.

If $PbTi_{1-x}Zr_xO_3$ ($0 \leq x \leq 1$) with and without dopants of La or Mn is used as a material for the piezoelectric layer 4, an anti-reaction layer of $TiO_2$, $Al_2O_3$ or $ZrO_2$ may be provided between the carrier layer and the second electrode.

In an alternative method of manufacturing an electronic component according to the invention, the reflection element 2 is directly deposited on the desired carrier substrate 1. Then the resonator unit comprising the first electrode 3 and the second electrode 5 plus the piezoelectric layer 4 is provided. The reflection element 2 may alternatively comprise several layers of alternately high and low impedance.

Alternatively, the dielectric of the capacitor is not formed from the piezoelectric layer 4, but a separate layer of a dielectric material with a low dielectric constant $\epsilon$ of $2 \leq \epsilon \leq 300$, for example comprising $SiO_2$, $Si_3N_4$, $Si_xO_yN_z$ ($0 \leq x \leq 1$, $0 \leq y \leq 1$, $0 \leq z \leq 1$), $Ta_2O_5$, $Ta_2O_5$—$Al_2O_3$, $Ta_2O_5$—$Nb_2O_5$, $Ta_2O_5$—$TiO_2$, or $TiO_2$.is provided on suitable portions of the first electrode 3 or the second electrode 5, in dependence on the manufacturing method.

Similarly, an electrode of the capacitor may be formed through deposition of an additional, separate electrically conducting layer.

In all cases, a protective layer 6 of an organic or inorganic material or a combination of these materials can be provided over the entire component. The organic material used may be, for example, polybenzocyclobutene or polyimide, and the inorganic material, for example, $Si_3N_4$, $SiO_2$, or $Si_xO_yN_z$ ($0 \leq x \leq 1$, $0 \leq y \leq 1$, $0 \leq z \leq 1$).

Alternatively, a reflection element may be provided below and above a resonator unit of the filter arrangement. The further reflection element comprises either a layer of a material of extremely low acoustic impedance, or several layers of alternately high and low impedance.

Furthermore, a layer of $SiO_2$ with a layer thickness of between 30 and 300 nm may be provided above or below, or above and below a reflection element 2 or a further reflection element of porous $SiO_2$. These $SiO_2$ layers, the reflection element 2, and a second reflection element may alternatively be provided over the entire region of the substrate 1.

At least a first and a second current supply contact may be provided on opposite sides of the filter arrangement. Possible current supply contacts are, for example, an electroplated SMD end contact of Cr/Cu, Ni/Sn or Cr/Cu, Cu/Ni/Sn, or Cr/Ni, Pb/Sn, or a bump end contact, or a contact pad.

Embodiments of the invention will be explained in more detail below, representing examples of how the invention may be carried into practice.

Embodiment 1

A filter arrangement of a bandpass filter and a notch filter was realized in that a 300 nm thick, dense $SiO_2$ layer was deposited on a glass substrate 1, and subsequently thereon a porous $SiO_2$ layer in the form of an aerogel as a reflection element 2 in a gluing process. Nine resonator units were provided on this reflection element 2, each comprising a first electrode 3, a piezoelectric layer 4, and a second electrode 5. The first electrode 3 comprised Pt. The second electrode 5 comprised a thin Ti adhesion layer and a Pt layer. The piezoelectric layer 4 had the composition $PbZr_{0.15}Ti_{0.85}O_3$. The piezoelectric layer 4 and the two electrodes 3 and 5 were deposited and structured such that on the one hand the bandpass filter with a total of nine bulk acoustic wave resonators was created. On the other hand, the two electrodes 3 and 5 and the piezoelectric layer 4 were structured in a different region of the substrate 1 such that a capacitor was formed in the vicinity of the arrangement of bulk acoustic wave resonators, which capacitor comprised a dielectric formed from the piezoelectric layer 4 and the two electrodes 3 and 5. The lower electrode 3 was connected to ground. At the same time, an inductance was created in series with the capacitor through the design and corresponding length of the first electrode 3 or second electrode 5. A protective layer 6 of $SiO_2$ was deposited over the entire filter arrangement. Subsequently, contact holes for contacting the first electrode 3 and the second electrode 5 were etched, and bump end contacts were grown thereon.

Such a filter arrangement was used for signal filtering in the high-frequency part of a mobile telephone.

Embodiment 2

The configurations described in Embodiments 2, 3 and 4 are understood in relation to FIG. 1 wherein the layers are sequenced from the top down, with second electrode 5 provided on carrier layer 6, made up of a base Si layer and a superimposed passivating layer of $SiO_2$. To manufacture a filter arrangement with a bandpass filter and a notch filter, first the second electrode 5 comprising a thin Ti adhesion layer and a Pt layer was provided on a carrier layer or Si with a passivating layer of $SiO_2$. A piezoelectric layer 4 of AlN was provided on this second electrode 5. Then a first electrode 3 comprising Pt was provided on the piezoelectric layer 4. The three layers were structured such that nine resonator units and one capacitor with a dielectric of AlN and the electrodes 3, 5 as well as an inductance were created. The lower electrode 3 was connected to ground. A 30 nm thick, dense $SiO_2$ layer, thereon a porous $SiO_2$ layer in the form of an aerogel as a reflection element 2, and on this reflection element 2 a 300 nm thick layer of $SiO_2$ were deposited on the first electrode 3 in the region where the resonator units were present. A substrate 1 of glass was fastened on the entire assembly by means of acrylate glue. Then the Si layer of the carrier layer was etched away. Contact holes for contacting the first electrode 3 and the second electrode 5 were etched into the remaining $SiO_2$ layer. Subsequently, bump end contacts of Cr/Cu were grown in the contact holes.

Embodiment 3

For manufacturing a filter arrangement with a bandpass filter and a notch filter, first the second electrode 5 with a thin Ti adhesion layer and a Pt layer was provided on a carrier layer of Si with a passivating layer of $SiO_2$. A piezoelectric layer 4 of $PbZr_{0.15}Ti_{0.85}O_3$ was provided on this second electrode 5. Then a first electrode 3 of Pt was provided on the piezoelectric layer 4. These three layers were structured such that on the one hand nine resonator units were created. The second electrode 5 was exposed through etching in one location laterally of the resonator units. The second electrode 5 was structured such that it served as an electrode for a capacitor and at the same time as an inductance on account of its design and length. A 0.5 μm thick $Si_3N_4$ layer was deposited over the entire arrangement and structured such that it remained only in the locations of the capacitor, where it served as a dielectric. A separate, electrically conducting layer of Al doped with Cu was provided on the $Si_3N_4$ layer and structured such that it formed the second electrode of the capacitor. This additional electrically conducting layer was connected to ground. A 30 nm thick dense $SiO_2$ layer was provided over the entire system, and on this $SiO_2$ layer was provided a reflection element 2 of a porous $SiO_2$ layer in the form of an aerogel, on which again a 300 nm thick layer of $SiO_2$ was deposited. A substrate 1 of glass was fastened on the entire assembly with acrylate glue. Then the Si layer of the carrier layer was etched away. Contact holes for contacting the second electrode 5 and the additional electrically conducting layer of Al doped with Cu were etched into the layers. Then bump end contacts of Cr/Cu were grown in the contact holes.

Such a filter arrangement was used for signal filtering in the high-frequency part of a mobile telephone.

Embodiment 4

To manufacture a filter arrangement with a bandpass filter and a notch filter, first an electrically conducting layer of Al doped with Cu was deposited on a carrier layer of Si with a passivating layer of $SiO_2$ and structured into the shape of electrodes. This electrically conducting layer of Al doped with Cu was connected to ground. A 0.5 μm thick layer of $Si_3N_4$ was deposited on this electrically conducting layer of Al doped with Cu. Then the second electrode 5 of Al doped with Cu was provided and structured such that it served as the second electrode 5 in the resonator units, as an inductance, and also as the second electrode for the capacitor. A piezoelectric layer 4 of AlN was provided on a portion of the second electrode 5. Subsequently, a first electrode 3 of Al doped with Cu was provided on the piezoelectric layer 4. These three layers were structured such that nine resonator units were created. The entire system was provided with a 30 nm thick $SiO_2$ layer. A porous $SiO_2$ layer in the form of an aerogel was provided on the $SiO_2$ layer as a reflection element 2, and on said reflection element 2 was deposited a 300 nm thick layer of $SiO_2$. A substrate 1 of glass was fastened on the entire assembly with acrylate glue. Then the Si layer of the carrier layer was etched away. Contact holes for contacting the second electrode 5 and the additional electrically conducting layer were etched into the layers. Then bump end contacts of Cr/Cu were grown in the contact holes.

Such a filter arrangement was used for signal filtering in the high-frequency part of a mobile telephone.

Embodiment 5

A filter arrangement of a bandpass filter and a notch filter as shown in FIG. 3 was realized in that a 300 nm thick, dense $SiO_2$ layer was deposited on a glass substrate 1, and subsequently thereon a porous $SiO_2$ layer in the form of an aerogel as a reflection element 2 in a gluing process. Nine resonator units were provided on this reflection element 2, each comprising a first electrode 3, a piezoelectric layer 4, and a second electrode 5. The first electrode 3 comprised Pt. The second electrode 5 comprised a thin Ti adhesion layer and a Pt layer. The piezoelectric layer 4 had the composition $KNbO_3$. The piezoelectric layer 4 and the two electrodes 3 and 5 were deposited and structured such that on the one hand the bandpass filter with a total of nine bulk acoustic wave resonators was created. On the other hand, the two electrodes 3 and 5 and the piezoelectric layer 4 were structured in a different region of the substrate 1 such that a capacitor was formed in the vicinity of the arrangement of bulk acoustic wave resonators, which capacitor comprised a dielectric formed from the piezoelectric layer 4 and the two electrodes 3 and 5. At the same time, an inductance was created in series with the capacitor through the design and corresponding length of the first electrode 3 or second electrode 5. The lower electrode 3 and the upper capacitor electrode 5 were electrically interconnected such that they served as the filter output 8. A protective layer 6 of $SiO_2$ was deposited over the entire filter arrangement. Subsequently, contact holes for contacting the first electrode 3 and the second electrode 5 were etched, and bump end contacts were grown thereon. Such a filter arrangement was used for signal filtering in the high-frequency part of a mobile telephone.

What is claimed is:

1. A method of manufacturing a filter arrangement, which comprises a substrate and provided thereon a bandpass filter of bulk acoustic wave resonators and a notch filter, by which method a second electrode (5), a piezoelectric layer (4), and a first electrode (3) are provided sequentially on a carrier layer with said second electrode (5) adjoining said carrier layer, and are structured such that at least one resonator unit, a capacitor, and an inductance are created, a reflection element (2) is deposited on those portions of the first electrode (3) which belong to the resonator unit, a substrate (1) is fastened on said first electrode (3), and the carrier layer is removed.

2. The method of claim 1 characterized in that the bandpass filter and the notch filter are thin-film filters.

3. The method of claim 1, wherein said carrier layer consist of a ceramic material, a ceramic material with a planarizing layer of glass, a glass-ceramic material, silicon, GaAs or sapphire.

* * * * *